(12) United States Patent
Hu et al.

(10) Patent No.: US 7,502,394 B2
(45) Date of Patent: *Mar. 10, 2009

(54) SYSTEM AND METHOD FOR MODULATING A SEMICONDUCTOR LASER

(75) Inventors: Martin H Hu, Painted Post, NY (US); Nobuhiko Nishiyama, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 78 days.

This patent is subject to a terminal disclaimer.

(21) Appl. No.: 11/298,367

(22) Filed: Dec. 8, 2005

(65) Prior Publication Data

US 2006/0159139 A1    Jul. 20, 2006

Related U.S. Application Data

(63) Continuation-in-part of application No. 11/002,978, filed on Dec. 3, 2004.

(51) Int. Cl.
*H01S 3/10* (2006.01)
*H01S 3/13* (2006.01)
*H01S 3/00* (2006.01)

(52) U.S. Cl. ............... 372/26; 372/29.014; 372/29.016; 372/38.01; 372/38.02; 372/38.07

(58) Field of Classification Search ................... 372/26, 372/29.014, 29.016, 38.01, 38.02, 38.07
See application file for complete search history.

(56) References Cited

U.S. PATENT DOCUMENTS

| | | | |
|---|---|---|---|
| 4,135,040 A | 1/1979 | Thornton | |
| 5,526,170 A * | 6/1996 | Esman et al. | 359/279 |
| 2001/0005388 A1* | 6/2001 | Hirata et al. | 372/22 |
| 2002/0012825 A1 | 1/2002 | Sasahara et al. | |
| 2004/0264525 A1 | 12/2004 | Senga et al. | 372/38.1 |

FOREIGN PATENT DOCUMENTS

| | | |
|---|---|---|
| EP | A-0 603 620 | 6/1994 |
| EP | A-0 642 185 | 3/1995 |
| EP | A-1 113 518 | 7/2001 |
| WO | WO 01/89017 A | 11/2001 |
| WO | WO 02/19445 A | 3/2002 |
| WO | 2005/091450 | 9/2005 |

* cited by examiner

*Primary Examiner*—Kenneth A Parker
*Assistant Examiner*—Hrayr A. Sayadian
(74) *Attorney, Agent, or Firm*—Svetlana Z. Short

(57) ABSTRACT

Both a system and method are provided for modulating the intensity of an output beam generated by semiconductor laser. The exemplary system includes a source of pulsating current connected to the laser that generates a pulsating beam of laser light, an external modulator having an input that receives the pulsating beam, and an output controlled by pulsating control signal, wherein the output beam transmitted by the external modulator output is modulated by changing a relative phase angle between the pulsating current powering the laser, and the control signal of the external modulator over time. The external modulator may be an intensity-type modulator whose output is controlled by a gate signal having a constant phase, and the source of pulsating current powering the laser may be variable phase in order to modulate the output beam with an external modulator having a simple structure. Both the system and method are advantageously compatible with DFB lasers, and avoid wavelength drift and the consequent thermally induced patterning effect by powering the laser with a pulsating current having a constant duty cycle.

23 Claims, 12 Drawing Sheets

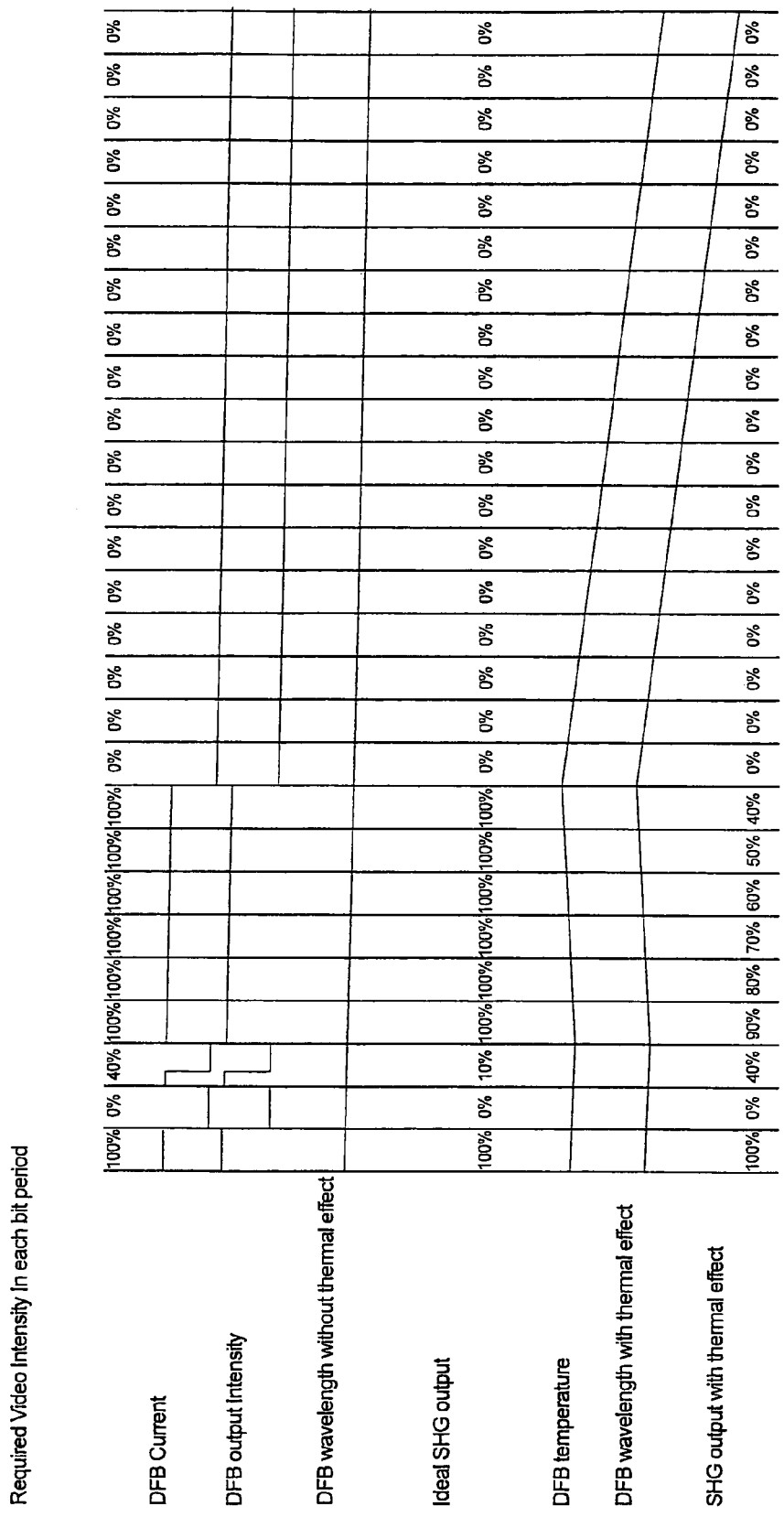

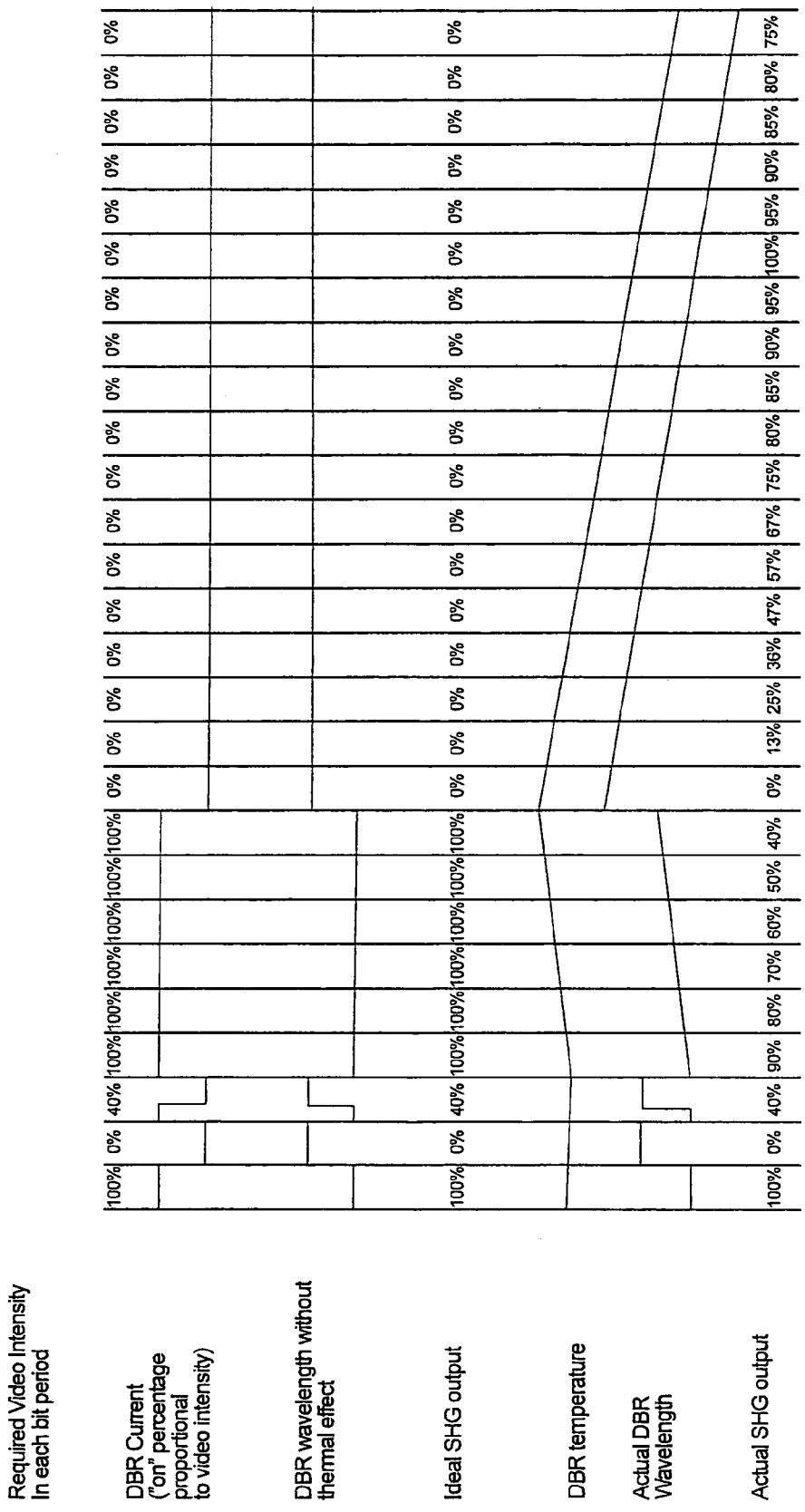

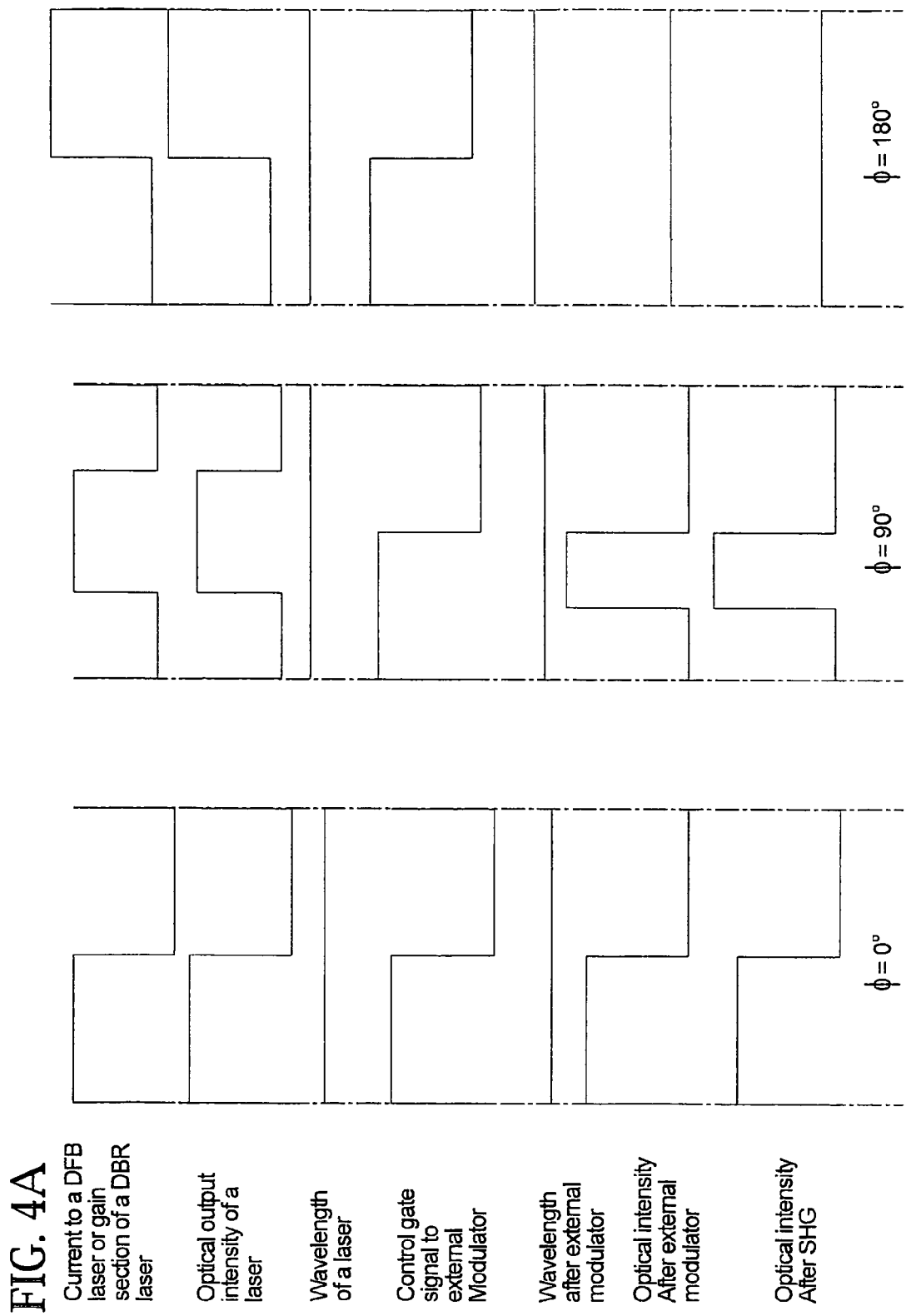

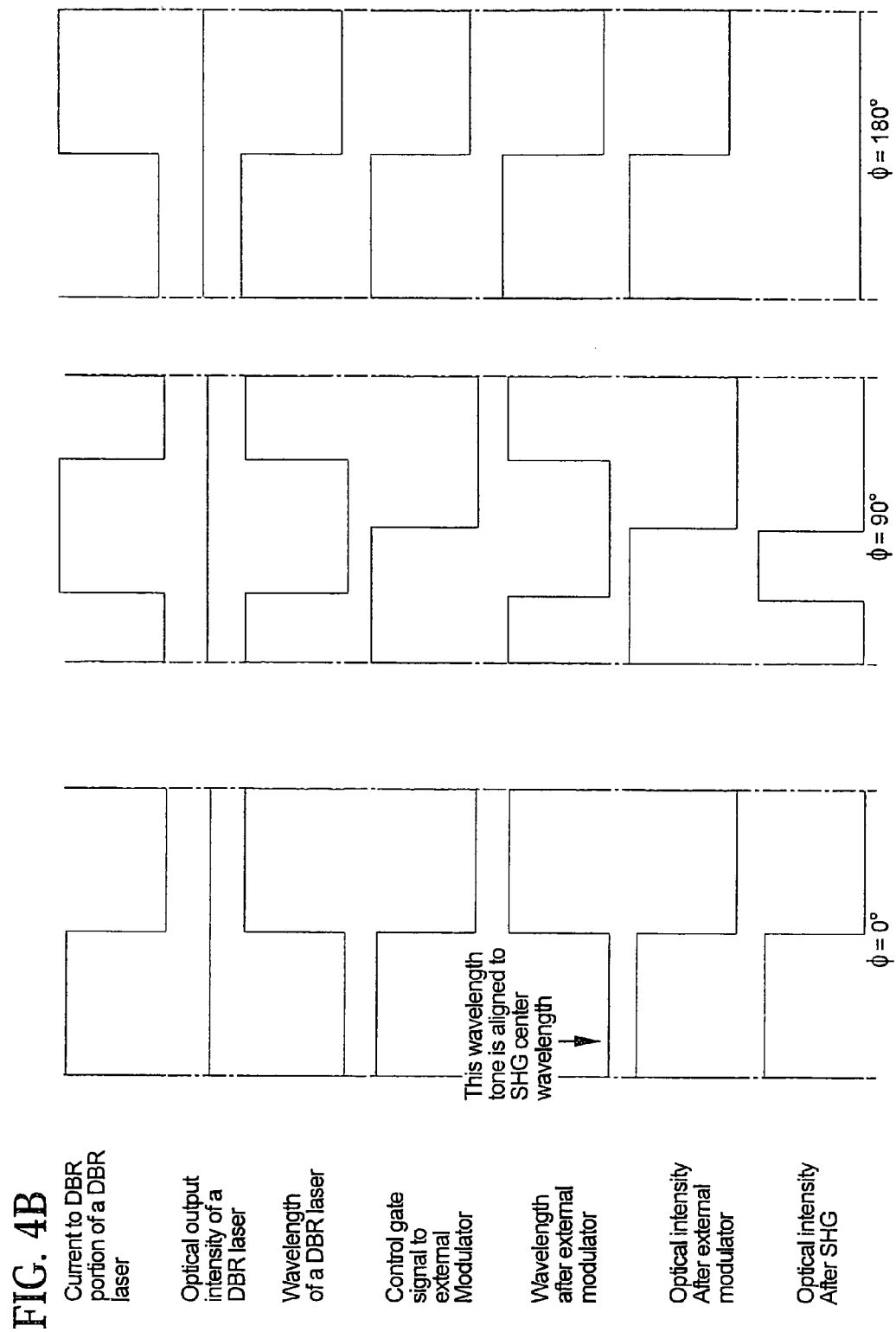

SYSTEM AND METHOD FOR MODULATING A SEMICONDUCTOR LASER

RELATED APPLICATIONS

This application is a continuation-in-part of U.S. Ser. No. 11/002,978, filed Dec. 3, 2004 by HU et al. and assigned to Corning, Inc.

BACKGROUND OF THE INVENTION

1. Field of the Invention

The present invention relates generally to the modulation of a semiconductor laser and more specifically to a system and method for modulating a distributed feedback (DFB) or a distributed Bragg reflector (DBR) semiconductor laser without undesirable, thermally induced wavelength drift.

2. Background

Lasers find particular utility in display technologies such as computer screens and televisions and the like. In such displays, lasers generate the three primary colors (red, blue and green) which are mixed in various combinations to provide a color image. The output beam of each laser can be raster-scanned across the screen or can be stationary and employed to illuminate pixels forming an image (e.g., a motion picture film or spatial light modulator containing an image). The ability of a laser to provide a beam having excellent brightness characteristics leads to projectors that are more efficient and better performing compared to projectors utilizing incandescent bulbs.

Semiconductor lasers such as DBR and DFB lasers are particularly useful for laser-based displays as their output beams can be efficiently converted to useful primary color wavelengths. For example, a 1060 nm DBR or DFB semiconductor laser tuned to a spectral center of a second-harmonic-generation (SHG) device such as a non-linear crystal may be used to generate a 530 nm beam. This provides a low-cost, compact and efficient non-linear source of green light.

Generally, for technologies involving video displays, the optical power used to generate the intensity of a primary color needs to be modulated at a fundamental frequency of approximately 50 MHz and with an extinction ratio (i.e., the ratio of highest to lowest optical power) of approximately 40 dB. The practical and economical achievement of such a combination of high modulation speed and large extinction ratio has proven difficult in the prior art.

One prior art technique for achieving a fast modulation and a large extinction-ratio in the combination of a semiconductor laser and second harmonic generator (SHG) is to rapidly modulate the wavelength of the output beam of the semiconductor laser. Such a modulation technique exploits the fact that non-linear SHG devices are typically capable of converting only a very narrow range of incoming laser wavelengths into longer wavelength light. In operation, the wavelength of the semiconductor laser beam rapidly scans across the narrow spectral width of a non-linear SHG device to produce the necessary intensity modulation. For example, if maximum green power is needed, the wavelength is tuned to the center wavelength of the non-linear crystal while, if zero green power is needed 10 ns later, the wavelength is tuned to one side or the other of the center wavelength that is outside of the spectral width of the SHG device.

FIG. 1A schematically illustrates a conventional DBR semiconductor laser 100 and a second harmonic generation (SHG) device 150. The DBR semiconductor laser 100 includes a DBR portion 110, a phase portion 120 and a gain portion 130. The gain portion 130, when injected with a continuous wave (CW) current, generates continuous optical power for the laser. The current injected into the DBR portion 110 makes large changes to wavelengths output from the laser and the current into the phase portion 120 makes small changes to the wavelength of the beam output of the laser. The SHG device 150 receives the beam produced by the semiconductor laser 100, whose output intensity of the converted wavelength (green, for example) depends upon alignment of the DBR laser wavelength and the SHG device's spectral center. The beam output from the SHG device 150 is then directed to an output such as a display screen.

FIG. 1B schematically illustrates a conventional DFB semiconductor laser 160 and an SHG device 170. The current injected into the DFB semiconductor laser 160 controls the output intensity from the laser, and the SHG device 170 receives the beam produced by the semiconductor laser 160. The output intensity of the converted wavelength (green, for example) depends upon the current input into the DFB semiconductor laser 160. The beam output from the SHG device 170 is then directed to an output such as a display screen.

The simplest way to rapidly tune the DBR semiconductor laser's output wavelength is by injecting modulated current into the DBR portion and phase portion of the DBR semiconductor laser 100 while keeping the gain-portion current continuous and constant. As illustrated in the chart provided in FIG. 2A, a video signal can require green light with an intensity of up to 100% within each bit period of the signal. The bit period width is the inverse of the system frequency, for example, the resident time of each pixel of a raster scan on a display screen. For the example shown in FIG. 2A, an intensity of 100% is the brightest possible signal while 0% is dark. Thus, as illustrated in FIG. 2A, the video intensity required for the first bit period is 100%, the intensity reduces to 0% for the second bit period and is increased to 40% for the third bit period.

With conventional systems, the current injected into the DBR portion 110 is pulse width modulated based on the required intensity in each bit period. That is, the duration within one bit period in which the current is "on" is proportional to the intensity of the video signal in that bit period (shown in the first waveform from the top of FIG. 2A). Ideally, the wavelength of the output of a DBR semiconductor laser is shifted based on the carrier-induced effect and output to the SHG device 150 (shown in the second waveform from the top of FIG. 2A). The SHG device 150, based upon the received beam, outputs a converted beam having an ideal intensity signal for display, as illustrated in FIG. 2A. However, the simple scheme described above ignores the possible adverse thermal effect that the injection of current into the laser causes.

Similarly, for a DFB laser, the current injected into the DFB laser 160 is pulse width modulated based on the required intensity in each bit period, as shown in FIG. 2B. Ideally, the wavelength of a DFB semiconductor laser is constant. However, the wavelength changes according to temperature, as shown in FIG. 2B.

Generally, current injection into the DBR portion of a DBR semiconductor laser generates two effects within the DBR semiconductor laser. First, a carrier effect is generated that provides more carriers in the portion increasing carrier density and reducing the refractive index within the laser. As a result, a shorter wavelength beam is generated. Current injection also causes a heating effect which causes the temperature of the DBR semiconductor laser device to rise. More specifically, currents higher than zero rise the temperature in the DBR semiconductor laser, thereby increasing the refractive indices, which tend to generate a longer wavelength beam.

The collective wavelength shift is produced by the combined effect of the carrier effect and thermal effect. For large current values that are needed to achieve large wavelength shift, the temperature rise is severe enough to reduce and sometimes completely reverse the carrier-induced wavelength shift. For the case of a DFB laser, the current injection causes DFB laser temperature to change and therefore red shifts the wavelength (i.e. shifts to a longer wavelength).

Another feature of current induced thermal effect is that it provides a slow wavelength modulation process. The thermal effect, which causes the temperature of the laser to increase, has µs-to ms response time compared to the carrier effect that has ns response time. The degree of thermal effect also depends upon the current amplitude and the heat sinking conditions associated with the laser. The slow response of the thermal effect means that the wavelength does not change for pulse widths much smaller than 1 µs, for example, 20 ns. Slow thermal effect results in an undesirable patterning effect because the average heating depends upon the width of pulses and therefore on the pattern of the video signal. In other words, the DBR or DFB semiconductor laser wavelength at a particular bit of the video signal depends on the history of the previous bits of data.

FIGS. 2A and 2B illustrate the effect that the injection of current, and the resulting increase in temperature, can have on the operation of the laser. The adverse effects resulting from a temperature rise in the laser are also shown in the charts of FIGS. 2A and 2B. Specifically, in FIG. 2A, when injection current is applied to the DBR portion 110 of the DBR semiconductor laser 100, and the current is constantly on, the DBR temperature rises as shown by the DBR temperature waveform in FIG. 2A. As a result, the actual DBR wavelength waveform provided from the laser to the SHG device 150 will be distorted, and the resulting output from the SHG device 150 will also be distorted, and the required intensity of the original video signal is not achieved at the output of the SHG device 150. These same adverse effects accompany the operation of DFB semiconductor lasers, shown in FIG. 2B. The actual DFB wavelength provided from the laser 160 to the SHG device 170 will be distorted, and the resulting output from the SHG device 170 will also be distorted.

Another example of modulating a semiconductor laser output is by modulating the output intensity instead of the wavelength that was discussed in previous paragraph. A modulating current is applied to the entire length of a DFB laser or the gain section of a DBR laser. High-level amplitude of the modulating current results in high output intensity and lower amplitude results in reduced output intensity. The laser wavelength is ideally maintained constant. For the case of an optical system consisting of a DBR or a DFB laser and a SHG, the laser output wavelength is desired to be constant and aligned to the spectral center of a SHG.

Accordingly, what is needed is a way to modulate the output of a semiconductor laser, or the combination of such a laser and an SHG, without the creation of thermal drift that in turn creates an undesirable thermal patterning effect. Ideally, such a technique should be compatible with short pulse widths on the order of 10 ns and an extinction ratio of 40 db so that a high bit rate of information can be transmitted. Finally such a modulation technique should be easy and inexpensive to implement, and compatible not only with DBR lasers, but lower-cost DFB lasers as well.

SUMMARY OF THE INVENTION

The invention is both a system and a method for the modulating of the intensity of an output beam generated by a semiconductor laser that overcomes the aforementioned shortcomings associated with the prior art. To this end, the system generally comprises a source of pulsating current connected to the laser that generates a pulsating beam, an external modulator having an input that receives the pulsating beam, and an output controlled by a pulsating control signal that transmits the output beam, wherein the output beam is modulated by changing a relative phase angle between the pulsating current and the control signal over time. Preferably, the pulsating current is variable phase while the control signal of the external modulator is constant phase so that a relatively simple and inexpensive external modulator may be used. While the external modulator may be either an intensity modulator or a wavelength modulator, an intensity-type modulator is again preferred for simplicity and cost reasons.

According to some of the embodiments of the present invention, both the pulsating current and the control signal may operate at a constant 50% duty cycle. Additionally, while the pulse width of the pulsating current and the control signal may be equal, the pulse width of the pulsating current may be slightly smaller than that of the control signal in order to improve the extinction ratio of the modulated output beam.

When an intensity-type external modulator is used, the control signal may be a gate signal, and the external modulator may advantageously be a video component such as a reflective wheel or prism that rotates at a constant rpm which has faces which are either light reflective or light absorptive.

The invention further encompasses a method for modulating the intensity of a pulsating beam generated by a semiconductor laser by means of an external modulator that comprises the steps of (1) providing a pulsating current to the laser; (2) receiving the pulsating beam into an input of an external modulator having an output that is controlled by a pulsating control signal, and (3) varying a relative phase angle between the pulsating current and the pulsating control signal to modulate laser light transmitted by the output of the external modulator.

Both the system and method advantageous eliminate wavelength drift and the previously described, thermally-induced patterning effect, and are compatible with relatively low cost DFB semiconductor lasers.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework to understanding the nature and character of the invention as it is claimed. The accompanying drawings are included to provide a further understanding of the invention, and are incorporated in and constitute a part of this specification. The drawings illustrate one or more embodiment(s) of the invention, and together with the description serve to explain the principles and operation of the invention.

BRIEF DESCRIPTION OF THE DRAWINGS

The above and other aspects, features and advantages of this invention will be described in relation to the following figures in which like reference characters refer to the same parts throughout the different views:

FIGS. 2A and 2B are charts illustrating the thermally induced patterning effect of the DBR semiconductor laser and SHG and the thermally induced patterning effect of the DBR semiconductor FB semiconductor laser and SHG;

FIGS. 4A, 4B and 4C illustrate characteristics associated with the differential phase external wavelength modulation scheme of the present invention; they show various embodiments of the present invention;

DETAILED DESCRIPTION

An exemplary embodiment of the present invention relates to a method and associated system to enable efficient operation of a DBR or DFB semiconductor laser and to reduce the thermal effects associated with semiconductor lasers. Although specific embodiments will be illustrated and described herein with regard to controlling the relative phase angle of current injected into a DBR semiconductor laser or into a DFB semiconductor laser and the control signal (also referred to as a pulsating gate signal herein) to an external modulation, it should be appreciated by those of ordinary skill in the art that such a system and method would also be advantageous, for example, in applications for any semiconductor laser device in which current injection can cause adverse thermal effects.

Additionally, while the DBR and DFB semiconductor lasers of the present invention are employed within an application directed to video signal processing and display, this disclosure is intended to cover any adaptations or variations of the present invention that generally relate to semiconductor lasers. For example, this invention can also be employed in such areas as optical data storage, image reproduction, optical communications as well as sensing instruments and the like.

In the following detailed description of the exemplary embodiments, reference is made to the accompanying drawings that form part hereof, and in which is shown by way of illustration, specific exemplary embodiments in which the invention may be practiced. These embodiments are described in sufficient detail to enable those skilled in the art to practice the invention, and it is to be understood that other embodiments may be utilized and that logical, mechanical and/or electrical changes may be made without departing from the spirit and scope of the present invention. The following detail description is therefore not to be taken in a limiting sense.

Figure 1A:
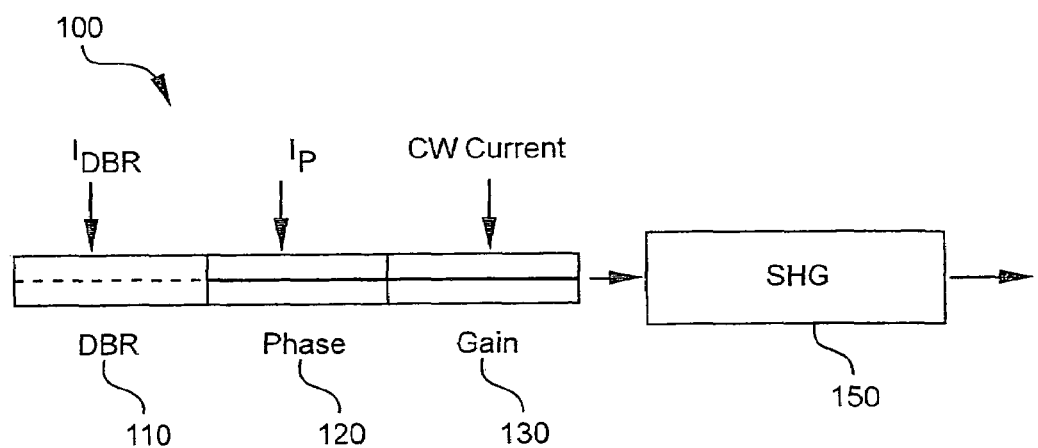
FIGS. 1A and 1B are schematic diagrams of a conventional 3-portion DBR semiconductor laser and a conventional DFB semiconductor laser with an SHG device.
Figure 1B:
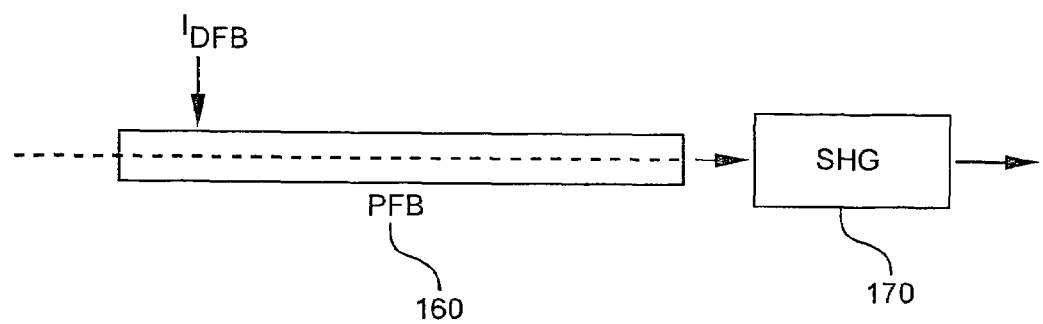
Figure 3A:
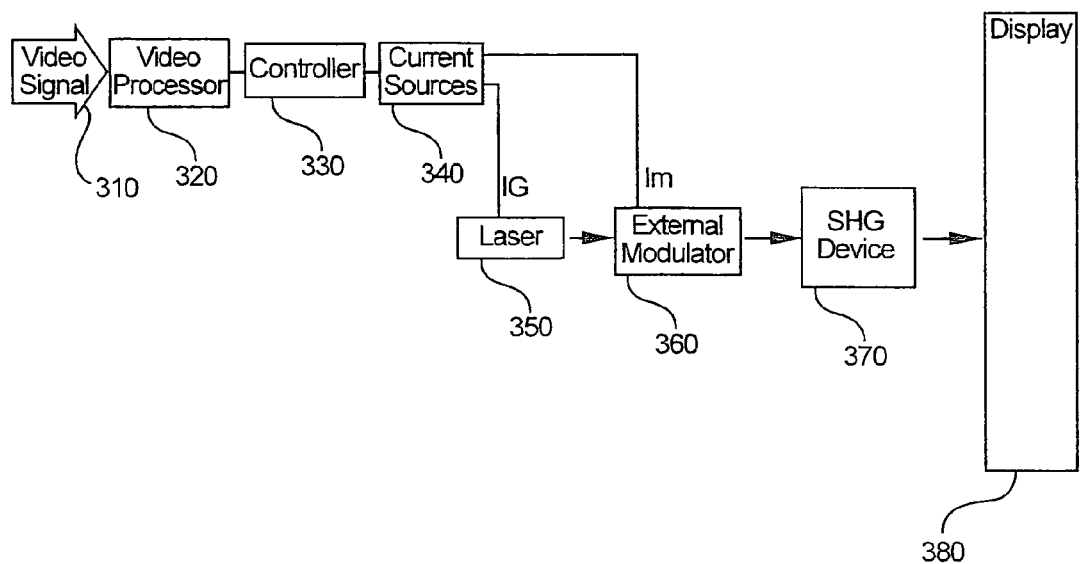
FIGS. 3A and 3B illustrate exemplary video display systems employing the external optical intensity modulator of the present invention.
Figure 3B:
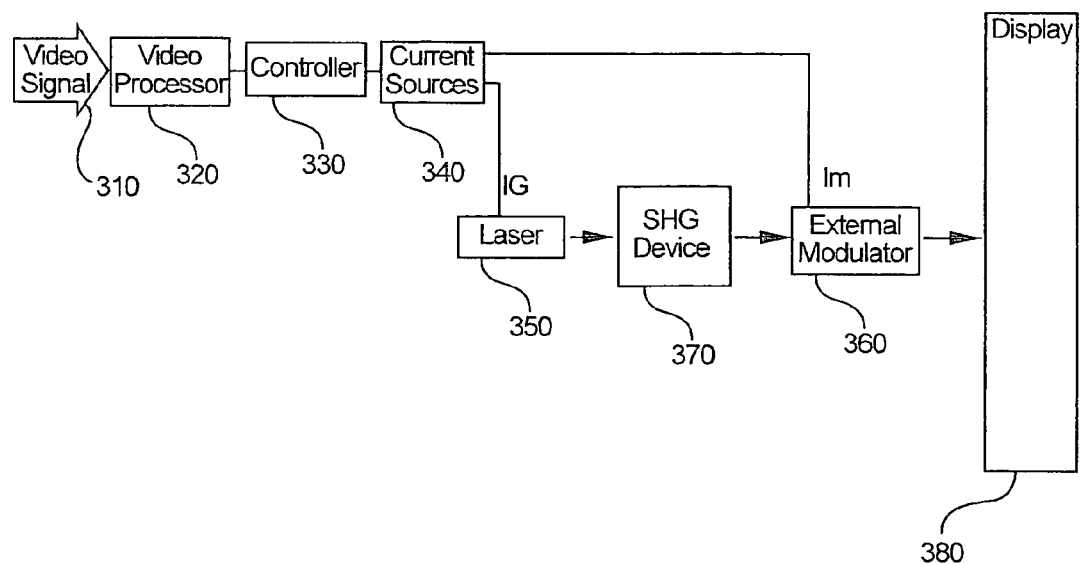

In accordance with an exemplary embodiment of the present invention, phase modulated current injection into a DBR or DFB semiconductor laser can be efficiently employed within a video display system, as shown generally in FIGS. 3A and 3B.

In FIG. 3A, a video signal 310 enters a video processor 320 that sends a signal to a controller 330. The controller 330 interfaces with analog driver circuits 340, which send current $I_G$ to the semiconductor DBR or DFB laser 350, and control (gate) signal $I_M$ (for example, modulation voltage, or current) to the external modulator 360 (for example, an acoustic optical modulator). The output of the semiconductor laser 350 is likewise sent through the external modulator 360, to a SHG device 370 and then is displayed 380. Similarly, in FIG. 3B, a video signal 310 enters a video processor 320 that sends a signal to a controller 330. The controller 330 interfaces with analog driver circuits 340, which send current $I_M$ to the external modulator 360 and current $I_G$ to the semiconductor DBR or DFB laser 350. The output of the semiconductor laser 350 is sent first a SHG device 370, then through the external modulator 360, and then is displayed 380.

Additionally while an SHG device is discussed in accordance with exemplary embodiments, other types of wavelength-selective devices could be employed to provide an output. For example, passive optical filters could also be employed. Passive optical filters do not convert the wavelength of the output from a laser.

FIG. 4A illustrates the characteristics of current to a DFB laser (or the gain section of the DBR laser) and control signal (i.e., pulsating gate signal) to the external modulator. As shown in the figures, the current pulses to the DFB laser (or the gain section of the DBR laser) have a fixed duty cycle. The duty cycle is the ratio of the time when the current is "on" to the total time of bit period (time "on" divided by a sum of "on" plus "off"). The thermal load to the DFB laser is constant for each bit period, and as a result, the wavelength of the DFB laser output is constant. The net output intensity of the system in each bit period is determined by the differential phase angle, or the overlap integral as shown in FIG. 5 below, between the current pulse to the DFB laser and the pulsating gate signal (i.e. pulsating control signal) to the external modulator. Because the external intensity modulator does not change the wavelength of the DFB output, the wavelength of the system is constant and aligned to the central wavelength of an SHG device without a patterning effect. The maximum conversion efficiency with the SHG is always realized.

FIG. 5 shows a graph of the differential phase, also represented as an overlap integral, between the current pulse to the DFB semiconductor laser and the gate pulse to the external modulator. FIG. 5 shows that the wavelength of the semiconductor laser (e.g, DBF semiconductor laser) is kept constant at 1060 nm and that the differential phase values change, resulting in changes (modulation) of the optical beam intensity.

Figure 4C:
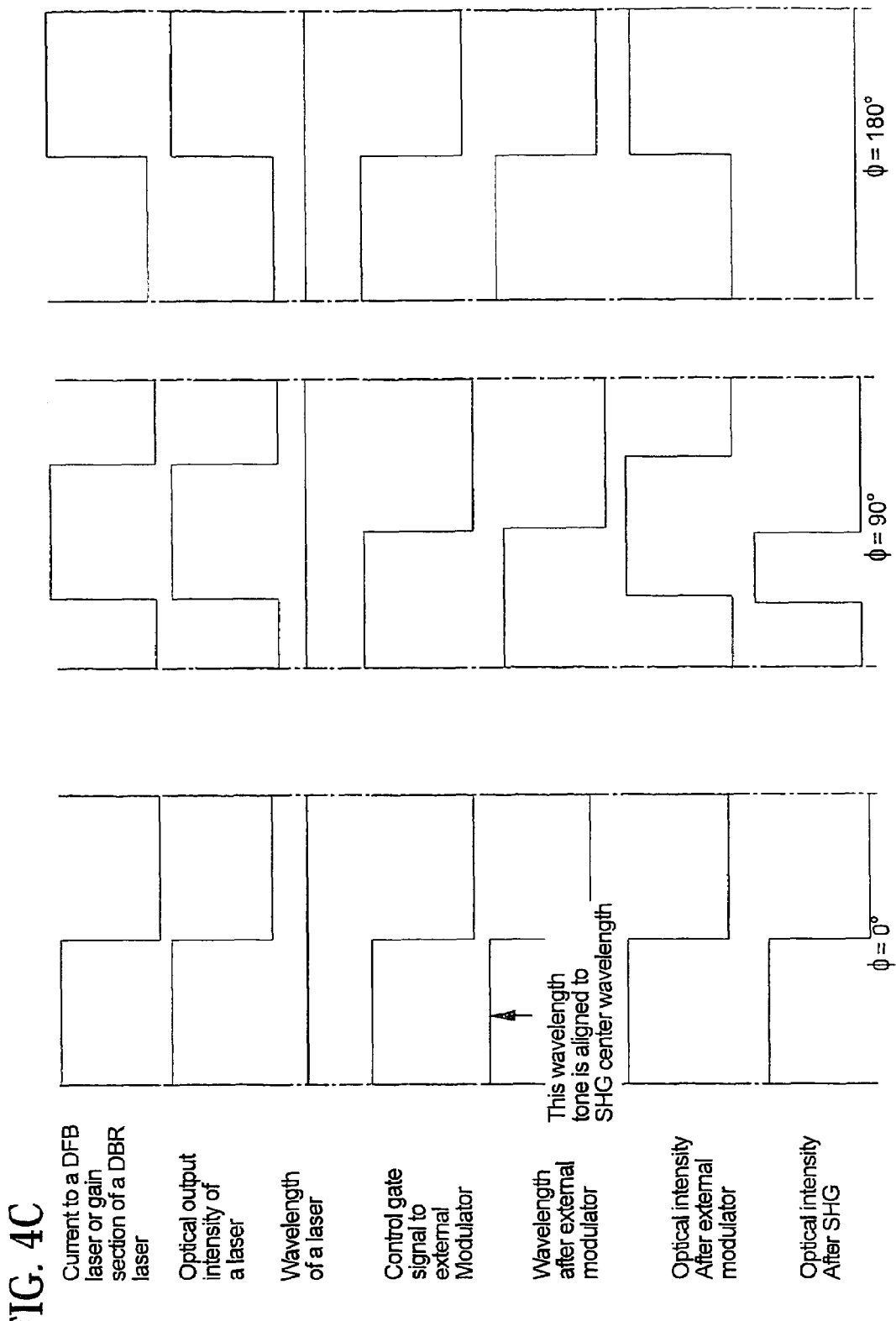
Figure 5:
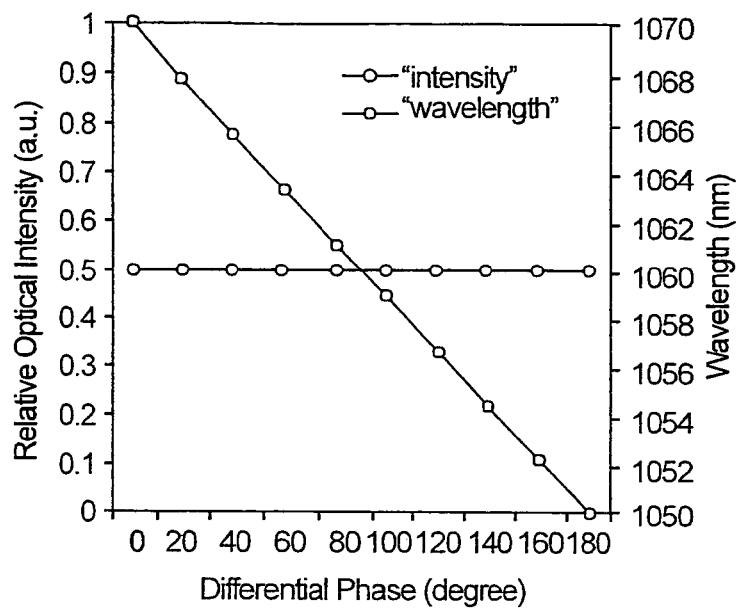
FIG. 5 illustrates the optical intensity of an optical system comprising of a DFB semiconductor laser and an external intensity modulator as a function of phase between current injection into DFB laser and gate signal into external intensity modulator in accordance with the present invention.

FIGS. 4A, 4B, 4C show various embodiments of present invention, using either a DBR or a DFB laser and an external modulator to create a differential phase, resulting in optical intensity modulation of the final output. In each of the embodiments, the control signal (i.e., pulsating gate signal) to the external modulator has a constant duty cycle, modulating either intensity or wavelength modulation. The intensity or wavelength of a laser, either DBR or DFB, are modulated by current with a variable time delay in a bit period that allows adjustment of the differential phase, because the changing of the phase angle for a laser modulation is more easily performed or less expensive than the changing of the phase angle of the control signal to the external modulator.

For applications that require high-speed operation, such as laser projection display, the current pulses to the DBR or DFB laser carry the fast video signal with phase adjusted in each bit period. A low-cost and simple external modulator is used to simply turn on and off at constant speed. For the video display application, the second intensity modulator can possibly be a part of an imaging system so that only a small additional cost is added to the overall system cost. For example, each fact of a polygon scanning mirror popular in many laser projection systems can be made with a "good" (or "on") surface and a "bad" (or "off") surface. When it is incident on the "good" surface, the light beam is directed onto the target display screen. When it is incident on the "bad" surface, the light beam is lost through scattering, absorption, diffraction, or reflection. In another example, a bi-position mirror can be integrated into the scanning mirror system to reflect the laser beam on and off at a 50% or less duty cycle. At each bit period, the phase angle of the current pulse to a DBR or DFB laser is adjusted to achieve the desired optical intensity.

FIG. 4A illustrates characteristics associated with the differential modulation scheme according to one embodiment of the present invention. In this embodiment both the semiconductor laser and the SHG device are intensity modulated (i.e., the optical beams from these devices are intensity modulated). More specifically, in this embodiment either the DFB semiconductor laser or the gain section of a DBR laser is modulated with current pulses. The current pulses to the DFB laser or gain section of a DBR laser have a fixed duty cycle but a variable phase angle. The fixed duty cycle results in a constant thermal load to the DFB laser or a DBR laser and a constant wavelength output. The external modulator (e.g. acoustic modulator) is modulated using a pulsating control (gate) signal with a fixed duty cycle and a constant phase angle that results in intensity modulation. The differential phase angle between the intensity modulation of the DFB laser or the gain section of a DBR laser and the intensity modulation of the external modulator determines the intensity of the final beam output (i.e, the system comprising the laser, the external modulator, SHG device; or the system comprising the laser, SHG device and the external modulator). When the differential phase angle is 0°, the pulse width of the SHG output is 50% of the bit period corresponding to 100% of the maximum intensity. Similarly, when the differential phase angle is 90°,—the pulse width of the SHG output is 25% of the bit period corresponding to 50% of the maximum intensity, and when the differential phase angle is 180°, the pulse width of the SHG output is 0% of the bit period corresponding to 0% of the maximum intensity.

FIG. 4B illustrates characteristics associated with the differential modulation scheme according to another embodiment of the present invention. In this embodiment the DBR semiconductor laser is wavelength and the external modulator is intensity modulated (i.e., the optical beams provided by the laser has a changing wavelength and the external modulator provides an output beam that is intensity modulated). More specifically, in this embodiment, the semiconductor laser used is a DBR semiconductor laser. In a DBR semiconductor laser, unlike a DFB laser which can only be intensity modulated, the wavelength and the intensity of the DBR laser can both be modulated, by changing the current to the DBR section of the laser and by changing the current to the gain section of the laser, respectively. In this embodiment, the wavelength of the DBR laser is modulated using current pulses with a fixed duty cycle and a variable phase angle. This may produce two different wavelengths, one corresponding to the "on" current and the other corresponding to the "off" current to the DBR section of a DBR laser. The intensity of the external modulator is modulated with a fixed duty cycle and a fixed phase angle, as in the previous embodiments. This embodiment takes the advantage that the SHG device is a wavelength-discriminating device and it is set to convert the wavelength corresponding to the laser's "on current" to a different (desired wavelength, for example green light), while the laser beam corresponding to other wavelength (i.e., to the "off" current) beam is passed through the SHG device unchanged. The result is a SHG device output with an optical intensity similar to the results of the previous embodiments. The differential phase angle between the wavelength modulation of the DBR laser and the intensity modulation of the external modulator determines the intensity of the output after the SHG device. When the differential phase angle is 0°, the pulse width of the SHG output is 50% of the bit period corresponding to 100% of the maximum intensity. Similarly, when the differential phase angle is 90°, the pulse width of the SHG output is 25% of the bit period corresponding to 50% of the maximum intensity, and when the differential phase angle is 180°, the pulse width of the SHG output is 0% of the bit period corresponding to 0% of the maximum intensity.

FIG. 4C illustrates characteristics associated with the differential modulation scheme according to another embodiment of the present invention. In this embodiment the DBR semiconductor laser is intensity modulated and the external modulator is wavelength modulated (i.e., the optical beams provided by the laser has a changing intensity and the external modulator that can be a SHG device provides an output beam that is changing wavelength). More specifically, in this embodiment, the semiconductor laser used is a DFB laser or a DBR laser. The DBF semiconductor laser or gain section of a DBR laser that is intensity modulated, exactly as described in reference to FIG. 4A. The current pulses to the DFB laser or gain section of a DBR laser have a fixed duty cycle but a variable phase angle. The fixed duty cycle results in a constant thermal load for the DFB laser or a DBR laser and a constant wavelength output. However, the external modulator that can be the SHG itself modulates the wavelength of the laser output with fixed duty cycle and fixed phase angle rather than the intensity. The resulting laser intensity after the SHG device is the same as the intensity of the previous embodiments. This embodiment takes the advantage that the SHG device is a wavelength-discriminating device and it is set to convert the wavelength corresponding to the external modulator's "on signal" to a different (desired wavelength, for example green light), while the laser beam corresponding to other wavelength (i.e., to the "off" signal) beam is passed through the SHG device unchanged. The differential phase angle between the intensity modulation of the DFB laser or the gain section of the DBR laser and the wavelength modulation of the external modulator determines the intensity of the output the pulse width of the SHG output. When the differential phase angle is 0°, the pulse width of the SHG output is 50% of the bit period corresponding to 100% of the maximum intensity. Similarly, when the differential phase angle is 90°, the pulse width of the SHG output is 25% of the bit period corresponding to 50% of the maximum intensity. When the differential phase angle is 180°, the pulse width of the SHG output is 0% of the bit period corresponding to 0% of the maximum intensity.

Figure 6:
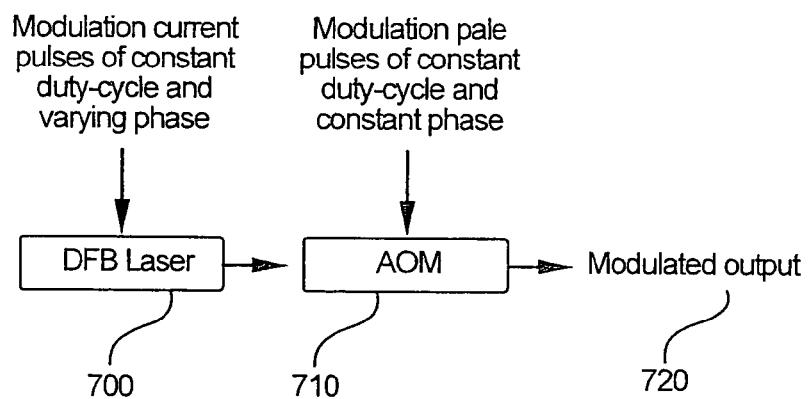
FIG. 6 illustrates a DFB semiconductor laser and AOM used to model the present invention.
Figure 7:
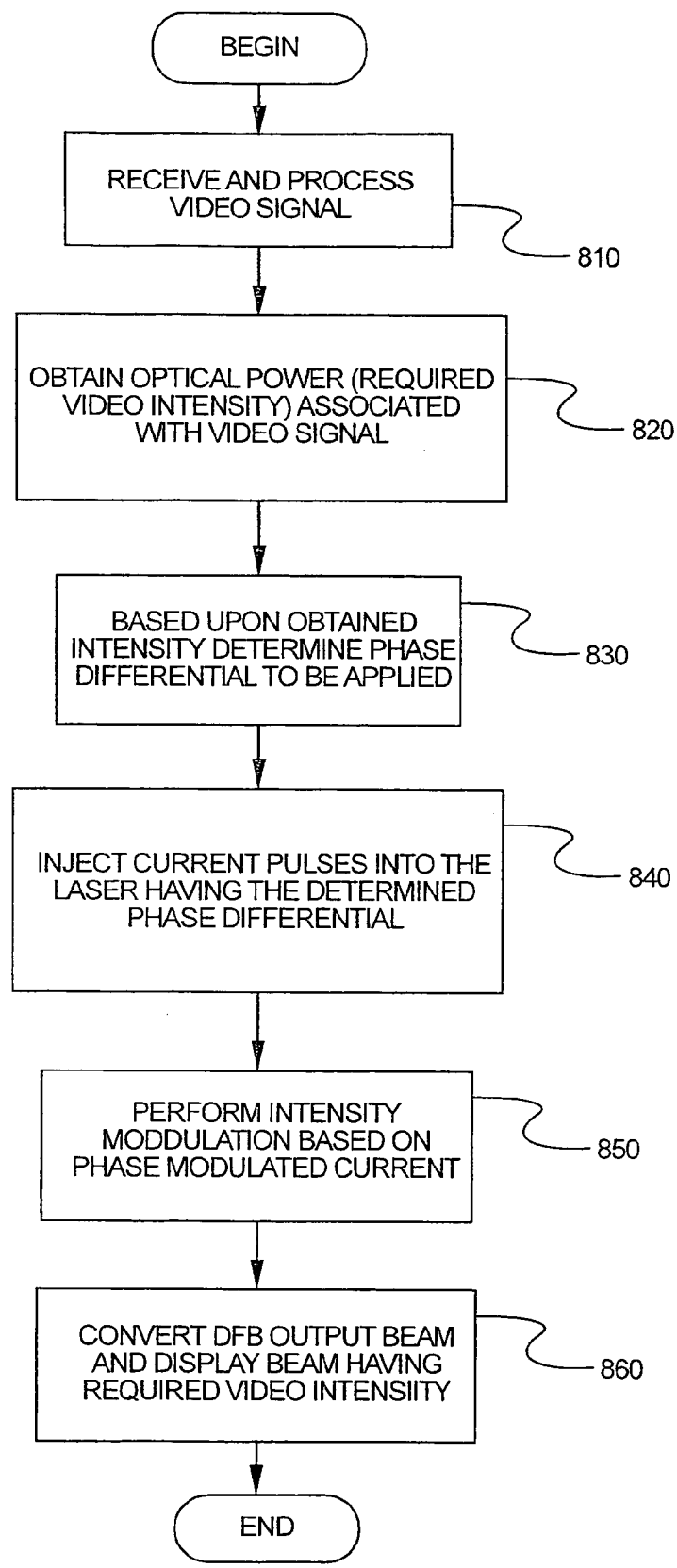
FIG. 7 illustrates a flow diagram providing a method of differential phase modulation in accordance with the present invention.

In testing, an acoustic optical modulator (AOM) 710 was used as the external intensity modulator, as shown in FIG. 6. The DFB laser 700 receives a modulation current with pulses of constant duty cycle and varying phase. The output, which has been intensity modulated, is received by the AOM 710 where the laser output is intensity modulated with a constant duty cycle and constant phase, to produce the modulated output 720. The procedure used is shown in FIG. 7. Initially, a video signal is received and processed in step 810. Then, the optical power, or required video intensity, associated with the video signal is obtained in step 820. Then, based upon the obtained intensity, the phase differential is determined in step 830. Next, current pulses are injected into the DFB laser in step 840, and the pulsating control signal (gate signal) is injected into the external intensity modulator in step 850. Finally, the output beam is passed through an SHG device and displayed in step 860.

Figure 8A:
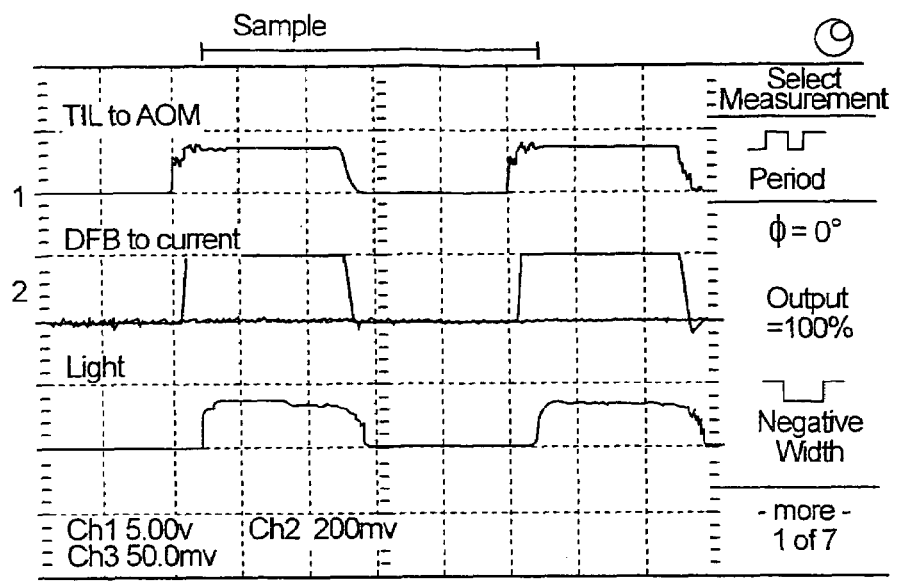
FIGS. 8A, 8B and 8C illustrate characteristics associated with a differential phase modulation scheme of the present invention with a constant duty cycle of 50% for the current pulse to the DFB laser and to the external modulator.
Figure 8B:
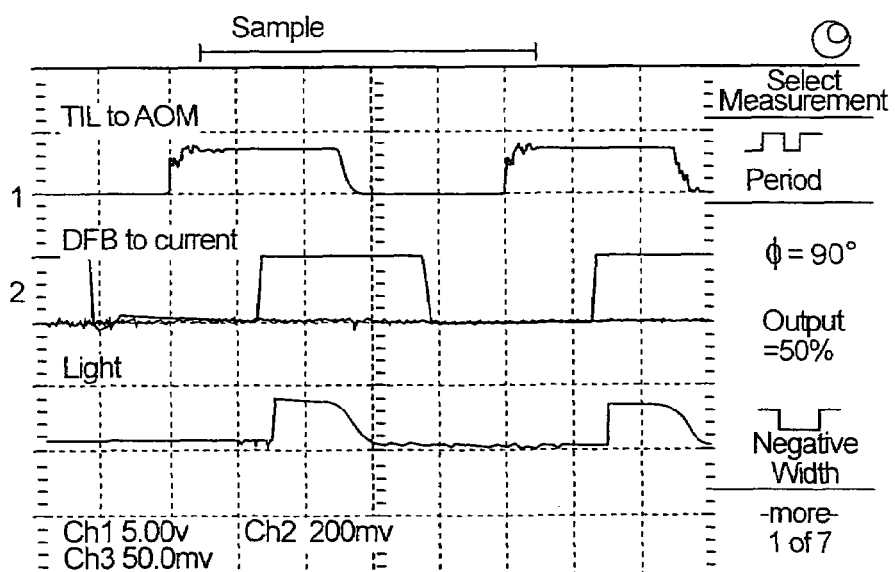
Figure 8C:
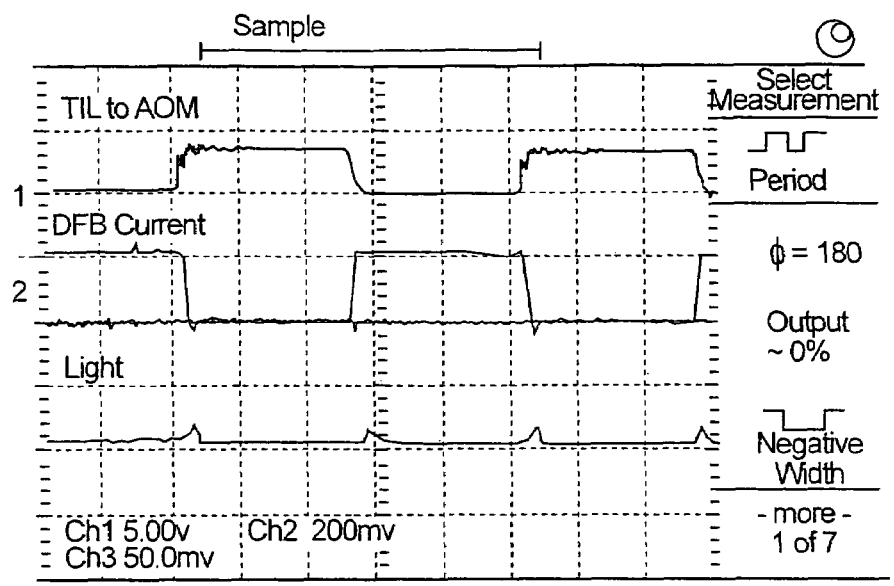
Figure 9A:
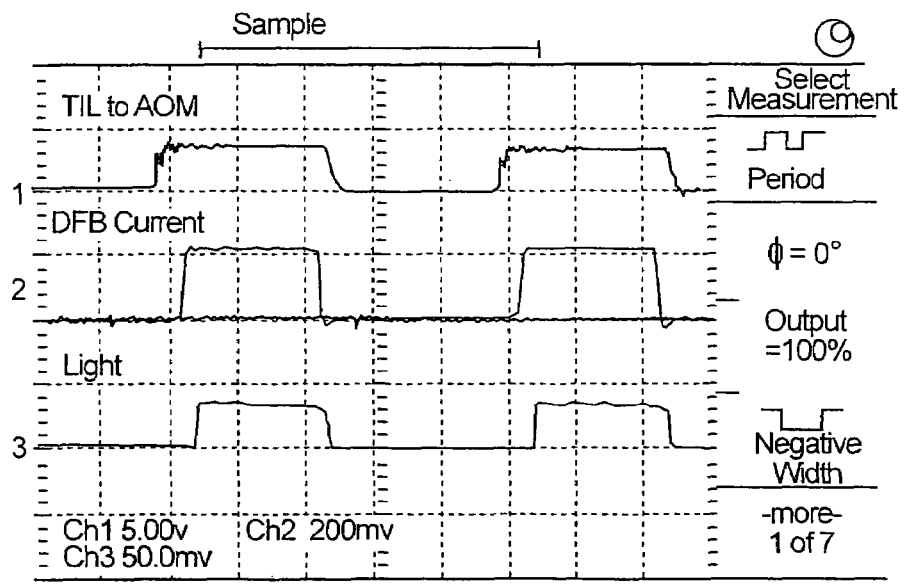
FIGS. 9A, 9B and 9C illustrate characteristics associated with a differential phase modulation scheme of the invention with a constant duty cycle of $\leq 50\%$ for the current pulse to the DFB laser and 50% to the external modulator.
Figure 9B:
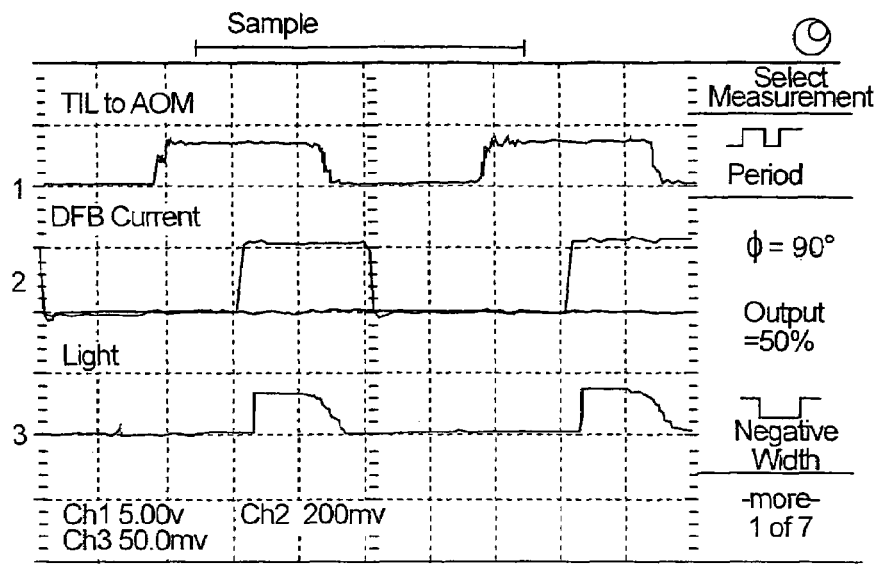
Figure 9C:
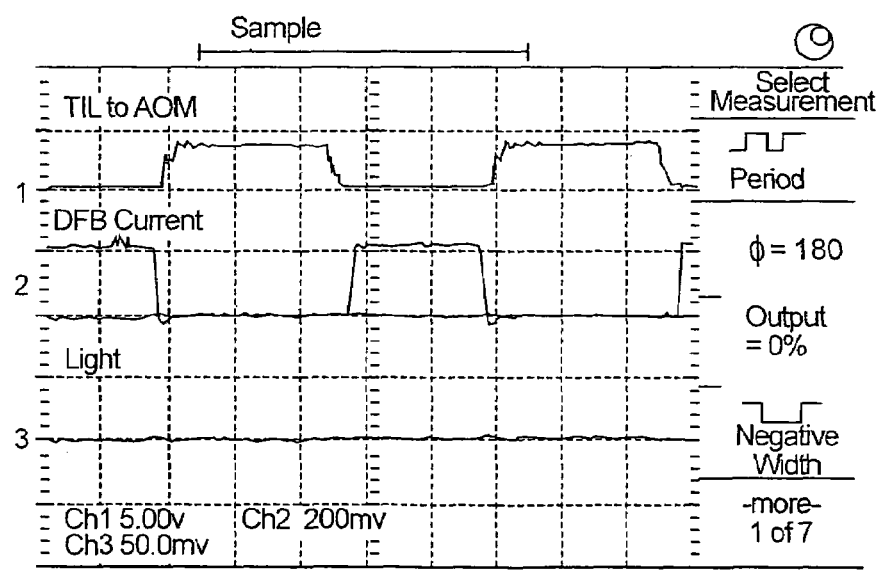

The results of several tests are shown in FIGS. 8A-8C and 9A-9C. In FIGS. 8A, 8B and 8C, the DFB duty cycle is 50% and the AOM duty cycle is 50%, similar to those duty cycles shown in FIG. 3A above. In FIG. 8A, the differential phase angle is 0°; in FIG. 8B, the differential phase angle is 90°; and in FIG. 8C, the differential phase angle is 180°. In FIG. 8C, the output optical intensity is not zero due to the non-ideal rise and fall times of the AOM. In FIGS. 9A, 9B and 9C, the DFB laser's current pulse duty cycle is <50% in order to improve the extinction ratio, and the AOM duty cycle is 50%. In FIG. 9A, the differential phase angle is 0°; in FIG. 9B, the differential phase angle is 90°; and in FIG. 9C, the differential phase angle is 180°.

The present invention provides several distinct advantages over conventional systems. By employing the present invention, under high-frequency current pulse injection, the temperature of the DBR or DFB laser is constant. By changing the phase differential angle between the current pulse to the laser and the pulsating control signal to the external modulator, the output intensity of the output beam provided by either the DBR or DFB laser in conjunction with the external modulator, such as or an acoustic modulator and/ for SHG example, can be changed without a thermally-induced patterning effect.

It is, therefore, apparent that there has been provided, in accordance with the present invention, a method and system for intensity modulation. While this invention has been described in conjunction with a number of illustrative embodiments, it is evident that many alternatives, modifications, and variations would be or are apparent to those of ordinary skill in the applicable arts. Accordingly, the disclosure is intended to embrace all such alternatives, modifications, equivalents and variations that are within in the spirit and scope of this invention.

The invention claimed is:

1. A system for modulating the intensity of an output beam generated by a semiconductor laser that generates a pulsating beam of laser light, said system comprising:
   a source of pulsating current connected to said laser, said source of pulsating current being structured such that said pulsating current has a constant duty cycle of no more than 50%,
   an external modulator;
   a source of pulsating control signal operatively (i) connected to the external modulator, and (ii) arranged such that a relative phase angle between said pulsating current and said control signal changes over time;
   wherein the external modulator is structured to: (A) be controlled by the pulsating control signal, and (B) to provide an output beam modulated by the changing relative phase angle between said pulsating current and said control signal over time, said external modulator having (i) an input that receives said pulsating beam of laser light, and (ii) an output that provides the modulated output beam.

2. The system of claim 1, wherein both the pulsating current and the control signal have a constant duty cycle.

3. The system of claim 1, wherein the phase angle of the pulsating current changes over time to modulate said output beam.

4. The system of claim 1, wherein the phase angle of the control signal changes over time to modulate said output beam.

5. The system defined in claim 1, wherein said pulsating beam is transmitted indirectly to said external modulator via a second harmonic generator.

6. The system defined in claim 1, wherein said pulsating beam is directly transmitted into said external modulator, and said modulated output beam is coupled to a second harmonic generator.

7. The system defined in claim 1, wherein said pulsating current operates at a constant 50% duty cycle.

8. The system defined in claim 1, wherein the control signal operates at a constant 50% duty cycle.

9. The system defined in claim 1, wherein the laser is one of a DFB and DBR solid state laser.

10. The system defined in claim 1, wherein the external modulator is one of an intensity modulator and a wavelength modulator.

11. The system defined in claim 1, wherein the external modulator is a video component.

12. The system defined in claim 8, wherein said external modulator is an electro-absorption modulator.

13. The system defined in claim 8, wherein said external modulator is a Mach-Zender interferometer modulator.

14. The system of claim 11, wherein said external modulator is a video component that rotates at a constant rate and has at least one light-reflective face and one light-absorbent face.

15. The system of claim 1, wherein the bit period for said pulsating current and said gate signal is less than 500 ns.

16. A method of operating a system for modulating the intensity of an output beam generated by a semiconductor laser, said method comprising:
   generating a pulsating beam of laser light with said laser;
   operatively connecting a source of variable phase pulsating current to said laser, and
   operatively connecting a source of pulsating gate signal having a constant phase operatively to an external intensity modulator, said external intensity modulator having (i) an input receiving, said pulsating beam of laser light, and (ii) an output providing an output beam,
   controlling said output of said external intensity modulator by said pulsating gate signal and modulating said output beam by varying the phase angle of said pulsating current relative to said constant phase of said gate signal over time.

17. A method of operating a system for modulating the intensity of an output beam generated by a semiconductor laser, said method comprising:
   utilising said laser to generate a pulsating beam of laser light with pulsating intensity and constant wavelength;
   operatively connecting a source of variable phase pulsating current to said laser, and
   receiving said pulsating beam by an external wavelength modulator, said modulator having (i) an input that receives said pulsating beam, and (ii) an output providing an output beam;

and controlling the output of said external modulator by a pulsating gate signal having a constant phase, said output beam is being modulated by varying the phase angle of said pulsating current relative to said constant phase of said gate signal over time, resulting in modulation of the pulse width of the output intensity of a specific wavelength.

18. A system for modulating the intensity of an output beam generated by a semiconductor laser, comprising:

a source of variable phase pulsating current connected to said laser that generates a pulsating beam of laser light with pulsating wavelength and constant intensity, and an external intensity modulator having (i) an input that receives said pulsating beam, and (ii) an output providing an output beam, said output being controlled by a pulsating gate signal having a constant phase, wherein said output beam is modulated by varying the phase angle of said pulsating current relative to said constant phase of said gate signal over time, resulting in modulation of the pulse width of the output intensity of a specific wavelength.

19. The method of claim 16, wherein said laser is a DFB laser.

20. The method of claim 16, wherein both said pulsating current and said gate signal operate at a substantially 50% duty cycle.

21. A method for modulating the intensity of a pulsating beam generated by a semiconductor laser with an external modulator, comprising the steps of:

providing a pulsating current to said laser to generate a pulsating beam of laser light;

providing an external modulator having an output and is controlling the output by a pulsating control signal;

receiving said pulsating beam into an input of the external modulator having the output that is controlled by the pulsating control signal, and varying a relative phase angle between said pulsating current and said pulsating control signal to modulate laser light transmitted by said output of said external modulator.

22. A system for modulating the intensity of an output beam, said system comprising:

semiconductor laser that generates a pulsating beam of laser light;

a source of pulsating current connected to said laser, and structured to provide a pulsating current with a constant duty cycle of no more than 50%;

an external modulator;

a source of pulsating control signal operatively (i) connected to the external modulator, and (ii) arranged such that a relative phase angle between said pulsating current and said control signal changes over time;

wherein the external modulator is structured to: (A) be controlled by the pulsating control signal, and (B) to provide an output beam modulated by the changing relative phase angle between said pulsating current and said control signal over time.

23. A method of using a system providing an output beam, said method comprising the steps of:

generating a pulsating beam of laser light with a semiconductor laser;

providing a pulsating current connected to said laser such that said pulsating current having a constant duty cycle of no more than 50%, operatively connecting a source of pulsating control signal to an external modulator, providing a relative phase angle between said pulsating current and said control signal that changes over time; and controlling said external modulator by the pulsating control signal.

* * * * *